United States Patent
Birdsley et al.

(10) Patent No.: US 6,621,281 B1
(45) Date of Patent: Sep. 16, 2003

(54) SOI DIE ANALYSIS OF CIRCUITRY LOGIC STATES VIA COUPLING THROUGH THE INSULATOR

(75) Inventors: Jeffrey D. Birdsley, Austin, TX (US);
Brennan V. Davis, Austin, TX (US);
Daniel L. Stone, Cedar Park, TX (US);
Michael R. Bruce, Austin, TX (US);
Rosalinda M. Ring, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 38 days.

(21) Appl. No.: 09/755,012

(22) Filed: Jan. 5, 2001

(51) Int. Cl.[7] ............................................. G01R 31/02
(52) U.S. Cl. .................................... 324/751; 324/765
(58) Field of Search .............................. 324/754, 763, 324/765, 750, 751, 752; 438/14, 17, 18; 257/40, 48, 296, 350; 250/307, 491.1, 492.21

(56) References Cited

U.S. PATENT DOCUMENTS

| | | | | |
|---|---|---|---|---|
| 5,821,549 A | * | 10/1998 | Talbot et al. | 250/307 |
| 6,020,746 A | * | 2/2000 | Livengood | 324/754 |
| 6,281,025 B1 | * | 8/2001 | Ring et al. | 438/10 |
| 6,414,335 B1 | * | 7/2002 | Goruganthu et al. | 257/48 |
| 6,518,783 B1 | * | 2/2003 | Birdsley et al. | 324/763 |

* cited by examiner

Primary Examiner—Vinh P. Nguyen

(57) ABSTRACT

Analysis of a semiconductor die having silicon-on-insulator (SOI) structure is enhanced by accessing the circuitry within die from the back side without breaching the thin insulator layer of the SOI structure. According to an example embodiment, a portion of substrate is removed from the back side of a semiconductor die having a SOI structure and a backside opposite circuitry in a circuit side. Electrical connection is made to a portion of the circuitry within the die via a capacitive coupling arrangement. The electrical connection is used to obtain an electrical measurement correlated with circuitry logic states of the die that is used for analysis.

21 Claims, 2 Drawing Sheets

SOI DIE ANALYSIS OF CIRCUITRY LOGIC STATES VIA COUPLING THROUGH THE INSULATOR

RELATED PATENT DOCUMENTS

The present invention relates to U.S. patent application Ser. No. 09/583,617, filed on May 31, 2000, entitled, "Electrical Probing of SOI Circuits," (Docket No. incorporated herein by reference in its entirety.

FILED OF THE INVENTION

The present invention relates generally to semiconductor dies and their fabrication and, more particularly, to analysis of semiconductor dies involving capacitive probing.

BACKGROUND OF THE INVENTION

The semiconductor industry has recently experienced technological advances that have permitted dramatic increases in integrated circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages.

A by-product of such high-density and high functionality is an increased demand for products employing these microprocessors and devices for use in numerous applications. As the use of these devices has become more prevalent, the demand for faster operation and better reliability has increased. Such devices often require manufacturing processes that are highly complex and expensive.

As the manufacturing processes for semiconductor devices and integrated circuits increase in difficulty, methods for testing and debugging these devices become increasingly important. Not only is it important to ensure that individual chips are functional, it is also important to ensure that batches of chips perform consistently. In addition, the ability to detect a defective manufacturing process early is helpful for reducing the number of defective devices manufactured.

Traditionally, integrated circuits have been tested using methods including directly accessing circuitry or devices within the integrated circuit. Directly accessing the circuitry is difficult for several reasons. For instance, in flip-chip type dies, transistors and other circuitry are located in a very thin epitaxially grown silicon layer in a circuit side of the die. The circuit side of the die is arranged facedown on a package substrate. This orientation provides many operational advantages. However, due to the facedown orientation of the circuit side of the die, the transistors and other circuitry near the circuit side are not readily accessible for testing, modification, or other purposes. Therefore, access to the transistors and circuitry near the circuit side is from the back side of the die.

One particular type of semiconductor device structure that presents unique challenges to back side circuit analysis is silicon-on-insulator (SOI) structure. SOI involves forming an insulator, such as an oxide, over bulk silicon in the back side of a semiconductor device. A thin layer of silicon is formed on top of the insulator, and is used to form circuitry over the insulator. The resulting SOI structure exhibits benefits including reduced switch capacitance, which leads to faster operation. Direct access to circuitry for analysis of SOI structure, however, involves milling through the oxide. The milling process can damage circuitry or other structure in the device. Such damage can alter the characteristics of the device and render the analysis inaccurate. In addition, the milling process can be time-consuming, difficult to control, and thus expensive.

The difficulty, cost, and destructive aspects of existing methods for testing integrated circuits are impediments to the growth and improvement of semiconductor technologies involving SOI structure.

SUMMARY OF THE INVENTION

The present invention is directed to a method and system for analyzing a semiconductor die having silicon-on-insulator (SOI) structure in a manner that addresses and can even overcome the above-discussed impediments. The die includes a back side opposite circuitry in a circuit side, and the die analysis involves coupling to determine the static logic state of the circuitry. The present invention is exemplified in a number of implementations and applications, some of which are summarized below.

According to an example embodiment of the present invention, a semiconductor die having SOI structure and a back side opposite circuitry in a circuit side is analyzed. A portion of substrate is removed from the back side of the semiconductor die and an exposed region of the insulator portion of the SOI die is formed. A detectable response is induced from the exposed region as a function of a static logic state of a portion of the circuitry. Detecting a response from the die in this manner expedites and enhances analysis of semiconductor devices that employ SOI construction, thereby improving the manufacture, testing, and technological advancement of such devices.

In another example embodiment of the present invention, an electron beam is directed at the exposed region in the semiconductor die using, for example, a scanning electron microscope (SEM). The electron beam generates secondary electrons in the exposed region that are detected and used to analyze the die. Such generation of secondary electrons occurs as a finction of an electrical characteristic, such as a logic state, of a portion of the circuitry in the die. This functional relationship between the generation of secondary electrons and the electrical characteristic of the circuitry is used to analyze the die.

According to another example embodiment of the present invention, a system is adapted to analyze a semiconductor die having silicon-on-insulator (SOI) structure and a back side opposite circuitry in a circuit side. The system includes a substrate removal arrangement adapted to remove substrate from the back side of the semiconductor die and form an exposed region in the insulator portion of the SOI structure. A probe arrangement is adapted to induce a detectable response from the exposed region as a function of the logic state of a portion of the circuitry. A detector is adapted to detect the response and to analyze the die therefrom.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
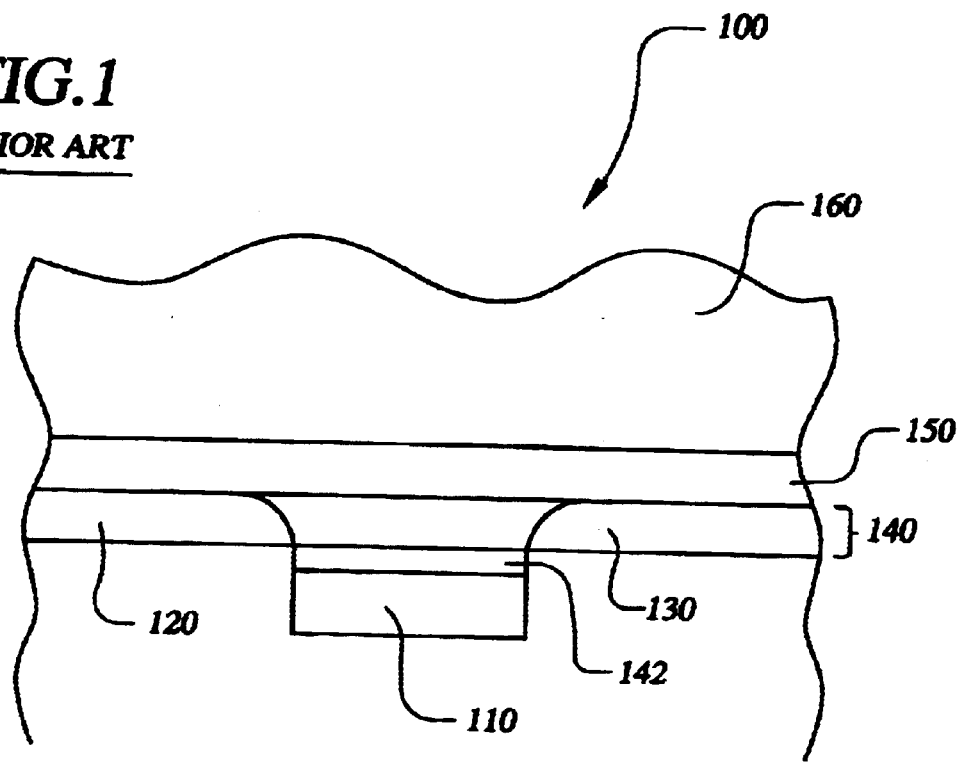
FIG. 1 is a semiconductor die having SOI structure for use in connection with the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and has been found to be particularly suited for flip-chip die and other type devices having silicon-on-insulator (SOI) structure and requiring or benefiting from analysis involving obtaining a response from the insulator portion of the SOI structure. While the present invention is not necessarily limited to such devices, various aspects of the invention may be appreciated through a discussion of various examples using this context.

According to an example embodiment of the present invention, a semiconductor die having a back side opposite circuitry in a circuit side and including SOI structure is analyzed using a response detected from the insulator portion as a function of the logic state of circuitry in the die. First, a portion of substrate is removed from the back side of the die, and an exposed region of the insulator of the SOI die is formed over circuitry in the circuit side. It has been unexpectedly discovered that, using the insulator as an electron-emitting dielectric, a probe can be used to detect a response from the dielectric to analyze the underlying circuitry. In this manner, electrical characteristics are obtained from the circuitry and used to analyze the die. The analysis can be used, for example, to determine die logic states for post-manufacturing analysis.

FIG. 1 shows a portion of a flip chip die 100 exemplifying one type of a variety of dies having SOI structure to which the present invention is applicable. The die of FIG. 1 is shown in an inverted position with the back side facing up, such as would be a flip die bonded to a package substrate. A very thin buried oxide (BOX) 150 is formed over silicon substrate 160, and a thin layer of silicon 140 is formed on the oxide 150. Source/drain regions 120 and 130 are formed in the thin layer of silicon 140. A gate 110, formed over the thin layer of silicon 140 and an intervening gate insulator layer 142, is used together with the source/drain regions to create a SOI transistor.

Figure 2:
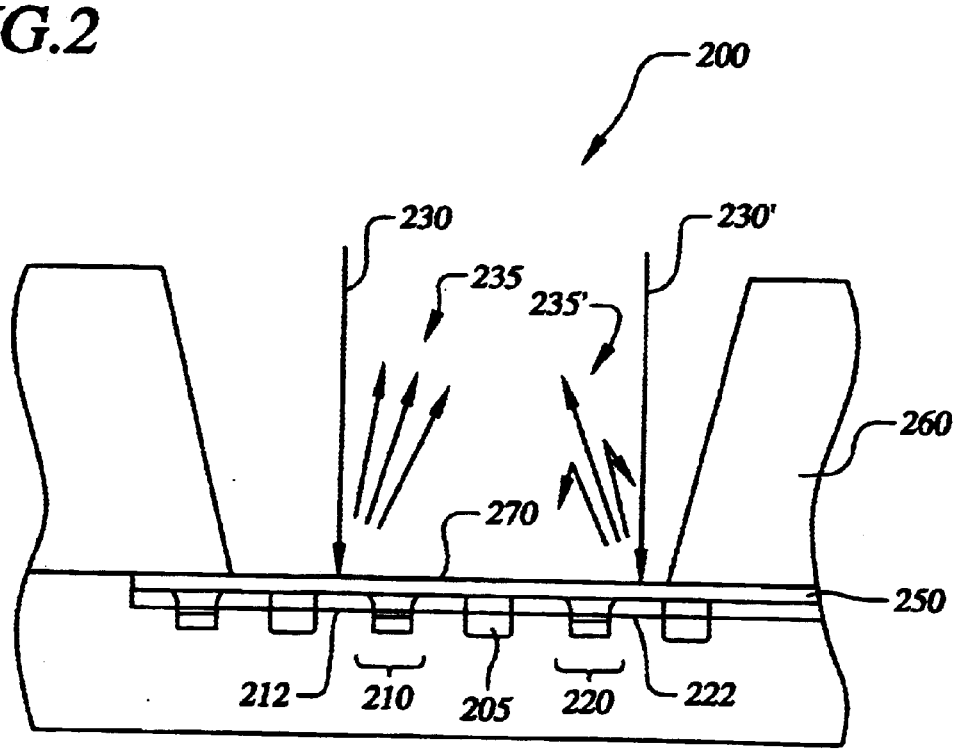
FIG. 2 is a semiconductor die undergoing analysis, according to an example embodiment of the present invention.

FIG. 2 shows a semiconductor die having SOI structure, such as shown in FIG. 1, undergoing analysis in accordance with another example embodiment of the present invention. A portion of silicon substrate 260 has been removed from the back side of the die 200, leaving an exposed probe surface 270 of a BOX layer 250. The substrate can be removed, for example, using typically-available substrate removal methods and devices, such as using a focused ion beam (FIB), a laser etching device, or an etch chamber having an etch gas and used in combination with a masking step. In one particular example embodiment (not illustrated), the back side silicon substrate is globally thinned using a polishing process, such as chemical-mechanical polishing, and is followed by a locally thinning process.

The probe surface 270 is shown on the BOX 250 in this example embodiment. However, the probe surface may be created in any manner sufficient to permit an electrical characteristic of a portion of circuitry in the die to be probed. For example, the probe surface may be formed in the substrate 260, wherein the amount of the substrate that has been removed creates an opening that is sufficiently deep to facilitate the capacitive coupling. In another example, a portion of the BOX 250 is removed and the probe surface 270 is created in the BOX 250, with the depth similarly chosen to facilitate the probing.

After the probe surface 270 has been defined, a probing arrangement is used to induce a response that is a function of the logic state of underlying circuit regions in the die. Transistors 210 and 220, separated by isolation region 205, are shown undergoing electron beam probing. First, an electron beam 230 is directed at a portion of the probe surface over a source/drain region 212 of transistor 210. The beam can be directed at selected regions by imaging the circuitry through the BOX and navigating to the selected region using the image, or using other typically available navigation methods. In one implementation, the electron beam is generated and controlled using a scanning electron microscope (SEM). The BOX 250 acts as a dielectric and facilitates capacitive coupling between the probe region and the source/drain region. Secondary electrons 235 are emitted in response to the electron beam and are modulated by electric fields in the BOX. In this instance, the electric field generated by the source/drain region 212 affects the emission of secondary electrons. If the source/drain region is at a positive voltage, such emission of secondary electrons is inhibited, and if the voltage is zero or negative, the emission of secondary electrons is generally unaffected. This variation in secondary electron emission is used to detect an electrical characteristic, such as a logic state, from the transistor 210.

Inducing a response that is a function of the logic state of an underlying circuitry region in the die includes inputting test vector signals to the die circuitry elements. The input signals are stopped at a selected point, and an electron beam that is directed at the probe surface is pulsed. The secondary electrons emitted from the probe surface are detected and analyzed to indicate the logic state of the circuitry at the vector of interest of the input signal. The process is repeated to obtain various selected logic states from a particular circuitry component, with the coupled response from the probe surface used to create an image representation of the logic state of the circuitry component.

In another implementation of the invention, the electron beam scans across the probe surface while pulsing to obtain coupled responses indicative of the logic state of multiple circuitry elements at a selected test vector input.

Referring to FIG. 2, the beam 230' is then caused to scan the transistor 220 and probe source/drain region 222 in a similar manner to which source/drain region 212 was probed. Secondary electrons 235' are emitted from source drain region 222 and used to detect an electrical characteristic, such as a logic state, from the region 222. As shown, the emission of secondary electrons 235' is inhibited as compared to secondary electrons 235. This inhibited emission is detected and used to detect that the two transistors exhibit different characteristics. In this instance, source/drain region 222 has a higher positive voltage than source/ drain region 212. The inhibited secondary electron response from source/drain region 222 is detected and used to determine that it is at a higher positive voltage. If desired, various other circuit portions of the die can be analyzed using the same technique, and responses can be used to detect variations in voltage across the die. The responses can then be used to create an image representing the voltage states, and thus the logic states of the die. For more information regarding capacitive coupling, probing and the detection of secondary electrons, reference may be made to Christopher G. Talbot, *Probing Technology for IC Diagnosis*, in FAILURE ANALYSIS OF INTEGRATED CIRCUITS 113, (Lawrence C. Wagner ed., 1999).

In another example embodiment of the present invention, a non-defective die is analyzed in the same manner as described hereinabove. Response data from the die can be obtained for one or several circuit elements to be subsequently analyzed in a defective die. The data from the non-defective die is then stored and compared with data obtained from the defective die. In one particular implementation, a series of test vectors are input to the non-defective die. The same signals are input to the defective die, and the response is compared. Variations in the response can be used to detect that the defective die is not operating properly.

Figure 3:
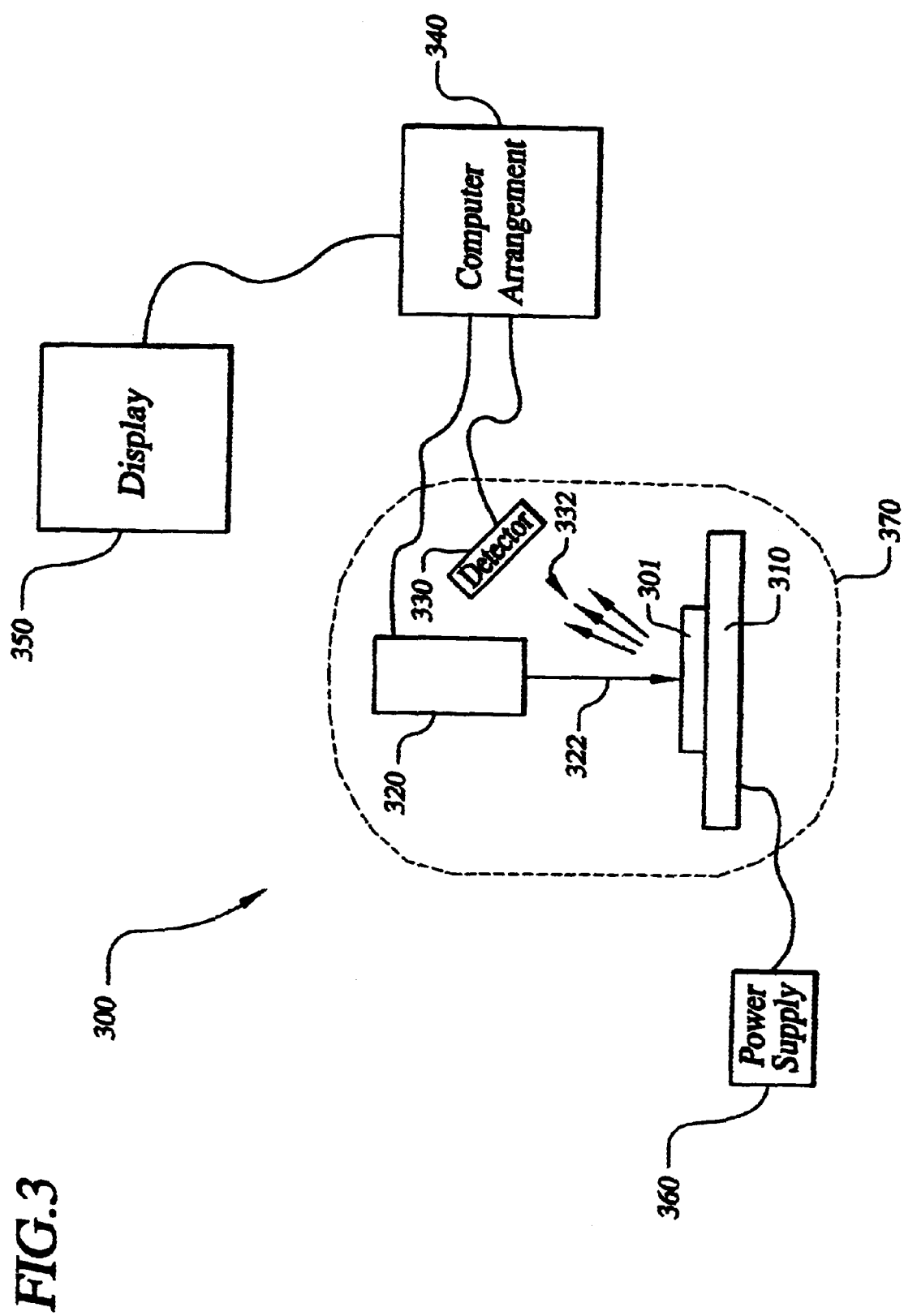
FIG. 3 is a system for analyzing a semiconductor die, according to another example embodiment of the present invention.

According to another example embodiment of the present invention, FIG. 3 shows a system 300 arranged to probe a semiconductor die 301 having SOI structure, such as the die shown in FIGS. 1 and 2. The die 301 is located on a die holder 310. An electron beam generator 320 is adapted to direct an electron beam 322 at an exposed probe region in the die 301. The beam 322 induces a response from the die via the BOX that is a function of the logic state of underlying circuitry in the die. A detector 330 is adapted to detect secondary electrons 332 emitted from the die 301 in response to the electron beam 322. The detected secondary electrons are used to detect an electrical characteristic of the die 301, such as described hereinabove. In one implementation, the die holder 310, beam generator 320 and detector 330 are part of a single SEM arrangement, shown by dashed lines 370.

The system 300 includes a controller adapted to control the probe, such as a computer arrangement 340. In one implementation, the computer arrangement is adapted to receive electrical characteristics of the die 301 via the detector 330 and interpret those characteristics to analyze the die. The computer arrangement 340 is programmed to control the beam generator 320 for obtaining various results. For instance, the beam can be pulsed rapidly to obtain a waveform response from the detector. The pulsing can be generated in sequences having duration in the microsecond, picosecond or even shorter range. This is particularly useful for obtaining waveforms from high frequency applications, and for obtaining a capacitive measurement in response to a particular input signal.

The computer 340 is further optionally coupled to a display 350 adapted to provide information indicative of the response from the detector 330. For example, the die 301 is powered by a supply 360 coupled to the die 301 via the holder 310. The supply 360 is used to input test vector signals to circuit elements of the die 301. In determining the logic state of circuitry components, the input signals to the die 301 are stopped at a vector of interest and the pulsing of the electron beam 322 is extended for several milliseconds. The die circuitry maintains its state for about 10–30 milliseconds after the input signal stops. The maintained charge induced on the surface of the BOX 250 is detected from the secondary electrons 332 emitted as the electron beam 322 scans for several milliseconds. The response is indicative of the logic state of the circuitry at the vector of interest of the input signal. The described sequence is repeated to obtain the logic state for circuitry components at any chosen time during the imput signal sequence.

In addition, the display 350 can be used to display an image of the die having variations in contrast related to the secondary electrons detected. Portions of the die emitting few secondary electrons (e.g., circuitry having a positive voltage) show up as dark spots, and portions emitting greater numbers of secondary electrons show up as bright spots. The variation in contrast observed in the display 350 is related to the logic state of the die circuitry.

In another example embodiment of the present invention, the input signals may include normal operating signals supplied to the die, or may include signals known to cause a failure in the die. In one particular implementation, the signals are input in a continuous loop that generates a failure in the die. The response is capacitively monitored and used for analyzing the die.

In another example embodiment of the present invention (not shown), the system 300 includes a substrate removal device adapted to remove substrate from the back side of the die 301 and form an exposed region having a probe area. In one implementation, the substrate removal device includes a FIB, and in another implementation, the substrate removal device includes a laser etching device. The exposed region is formed having a depth that is sufficient to facilitate inducing a response related to a source/drain region or other circuitry portion in the die, such as by exposing a BOX layer in a SOI structure.

While the present invention has been described with reference to several particular example embodiments, those skilled in the art will recognize that many changes may be made thereto without departing from the spirit and scope of the present invention, which is set forth in the following claims.

What is claimed is:

1. A method for analyzing a semiconductor die having silicon-on-insulator (SOI) structure and a back side opposite circuitry near a circuit side, the method comprising:

removing a portion of substrate from the back side of the semiconductor die and exposing a region of the insulator of the SOI structure where the portion of substrate has been removed; and inducing a detectable response from the exposed region as a function of a static logic state of a portion of the circuitry and, therefrom, analyzing the die.

2. The method of claim 1, wherein inducing a detectable response includes using an electron beam.

3. The method of claim 2, wherein analyzing the die includes using a scanning electron microscope (SEM) and detecting secondary electrons generated in response to the electron beam and the static logic state of the portion of the circuitry.

4. The method of claim 3, wherein analyzing the die includes detecting a first magnitude of secondary electrons from a selected circuit portion and a second magnitude of secondary electrons from another circuit portion, the first and second magnitudes of secondary electrons being indicative of an electric characteristic differential between the selected circuit portion and the other circuit portion.

5. The method of claim 4, further comprising detecting secondary electrons from a plurality of circuit portions and obtaining an image of the die that represents variations in voltage across the plurality of circuit portions.

6. The method of claim 2, wherein inducing a detectable response includes coupling a power supply to the die, inputting electrical signals to the die, ceasing the electrical signals and pulsing the electron beam to analyze the die.

7. The method of claim 1, wherein inducing a detectable response includes inducing a response as a function of an electrical characteristic of a source/drain region in the die.

8. The method of claim 1, wherein inducing a detectable response includes using a buried oxide (BOX) portion of the SOI structure as a dielectric.

9. The method of claim 8, wherein removing a portion of substrate from the back side of the semiconductor die includes exposing a portion of the BOX.

10. The method of claim 1, wherein analyzing the die includes analyzing for post-manufacturing analysis.

11. The method of claim 6, wherein inputting electrical signals includes inputting signals known to induce a failure in the die.

12. The method of claim 6, wherein inputting electrical signals includes inputting signals in a continuous loop.

13. The method of claim 1, further comprising inducing a detectable response from a non-defective die in the same manner as the die being analyzed, the non-defective die having the same design as the die being analyzed, and comparing the analysis of the dice.

14. A system for analyzing a semiconductor die having silicon-on-insulator (SOI) structure and a back side opposite circuitry near a circuit side, the system comprising:
    means for removing substrate from the back side of the semiconductor die and forming a probe region where the substrate has been removed;
    means for inducing a detectable response from the exposed region as a function of the static logic state of a portion of the circuitry; and
    means for detecting the response and, therefrom, and analyzing the die.

15. A system for analyzing a semiconductor die having silicon-on-insulator (SOI) structure and a back side opposite circuitry near a circuit side, the system comprising:
    a substrate removal arrangement adapted to remove substrate from the back side of the semiconductor die and expose a region of the insulator of the SOI structure where the portion of substrate has been removed;
    a probe arrangement adapted to induce a detectable response from the exposed region as a function of the static logic state of a portion of the circuitry; and
    a detector adapted to detect the response and, therefrom, analyze the die.

16. The system of claim 15, further comprising a controller adapted to control the substrate removal arrangement.

17. The system of claim 16, wherein the controller is adapted to control the substrate removal arrangement to remove enough substrate to facilitate the inducing of a response from the exposed region as a function of the static logic state of a portion of the circuitry.

18. The system of claim 15, wherein the substrate removal arrangement is adapted to remove enough substrate to expose a BOX portion of the SOI structure.

19. The system of claim 15, wherein the probe arrangement includes a SEM.

20. The system of claim 19, wherein the SEM also includes the detector and is further adapted to obtain an image of the die having light and dark areas, the dark areas being indicative of circuit portions having a positive voltage greater than that of lighter areas.

21. The system of claim 15, wherein the probe arrangement includes a power supply adapted to input electrical signals to the die.

* * * * *